United States Patent
Millar

(10) Patent No.: US 9,685,960 B2
(45) Date of Patent: Jun. 20, 2017

(54) METHOD AND APPARATUS FOR GENERATING A BIT STREAM SIGNAL HAVING A REDUCED OUTPUT SWING

(71) Applicant: Valeo Radar Systems, Inc., Hudson, NH (US)

(72) Inventor: Jeffrey Millar, Mont Vernon, NH (US)

(73) Assignee: Valeo Radar Systems, Inc., Hudson, NH (US)

(*) Notice: Subject to any disclaimer, the term of this patent is extended or adjusted under 35 U.S.C. 154(b) by 372 days.

(21) Appl. No.: 14/448,068

(22) Filed: Jul. 31, 2014

(65) Prior Publication Data

US 2016/0033620 A1    Feb. 4, 2016

(51) Int. Cl.
| G01S 7/282 | (2006.01) |
| H03L 7/00 | (2006.01) |
| G01S 7/03 | (2006.01) |
| G01S 7/35 | (2006.01) |
| G01S 13/34 | (2006.01) |
| G01S 13/93 | (2006.01) |

(52) U.S. Cl.
CPC .............. H03L 7/00 (2013.01); G01S 7/032 (2013.01); G01S 7/35 (2013.01); G01S 13/345 (2013.01); G01S 13/931 (2013.01)

(58) Field of Classification Search
CPC .................. H03L 7/00; G01S 7/32; G01S 7/35
USPC .................................... 342/70, 195, 200–202
See application file for complete search history.

(56) References Cited

U.S. PATENT DOCUMENTS

| 4,660,040 A * | 4/1987 | Grandos | G01S 13/345 |
| | | | 342/128 |
| 5,216,374 A * | 6/1993 | George | H03L 7/00 |
| | | | 327/105 |
| 6,549,078 B1 * | 4/2003 | Sridharan | H03C 3/0925 |
| | | | 327/156 |
| 6,621,449 B1 * | 9/2003 | Kunert | G01S 7/35 |
| | | | 332/126 |
| 8,731,502 B2 * | 5/2014 | Salle | G01S 7/032 |
| | | | 332/103 |
| 2004/0232960 A1 * | 11/2004 | Albasini | H03L 7/1976 |
| | | | 327/156 |

(Continued)

OTHER PUBLICATIONS

Search Report and Written Opinion darted Oct. 14, 2015 for PCT Application No. PCT/US2015/041113; 9 pages.

(Continued)

*Primary Examiner* — Marcus Windrich
(74) *Attorney, Agent, or Firm* — Daly, Crowley, Mofford & Durkee, LLP

(57) ABSTRACT

An automotive radar apparatus includes a bit stream modulation circuit configured to generate a bit stream signal at an output thereof and a driver circuit having an input coupled to the output of said bit stream modulation circuit and configured to generate a corresponding driver bit stream signal having a reduced output swing at the driver circuit output. Also included is a filter circuit having an input coupled to the output of said driver circuit and configured to generate a filtered bit stream signal at the filter circuit output. Additionally included is a VCO having an input coupled to the output of said filter circuit and configured to generate an RF output signal at the VCO output. A corresponding method is also provided.

22 Claims, 5 Drawing Sheets

(56) References Cited

U.S. PATENT DOCUMENTS

| | | | | |
|---|---|---|---|---|
| 2009/0195321 A1* | 8/2009 | Saunders | ................ | G01S 7/032 |
| | | | | 331/17 |
| 2009/0195440 A1* | 8/2009 | Saunders | ................ | G01S 7/032 |
| | | | | 342/175 |
| 2013/0249612 A1* | 9/2013 | Zerbe | ................... | H04L 7/0079 |
| | | | | 327/161 |
| 2013/0328633 A1* | 12/2013 | Zhang | ....................... | H03L 7/24 |
| | | | | 331/34 |
| 2015/0123828 A1* | 5/2015 | Alldred | ................ | H03M 3/376 |
| | | | | 341/143 |

OTHER PUBLICATIONS

International Preliminary Report on Patentability dated Feb. 9, 2017 for PCT Application No. PCT/US2015/041113; 15 pages.

* cited by examiner

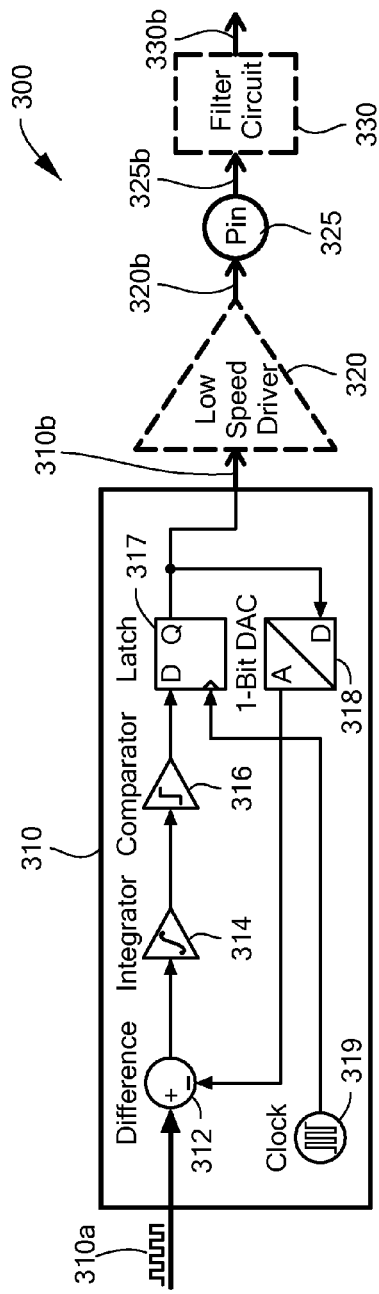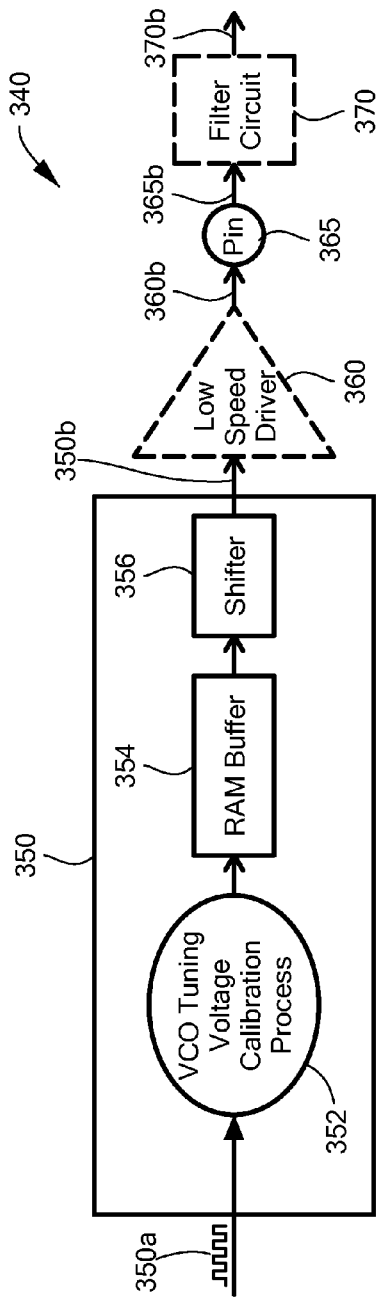

METHOD AND APPARATUS FOR GENERATING A BIT STREAM SIGNAL HAVING A REDUCED OUTPUT SWING

CROSS REFERENCE TO RELATED APPLICATIONS

Not Applicable.

STATEMENT REGARDING FEDERALLY SPONSORED RESEARCH

Not Applicable.

FIELD

This disclosure relates generally to driver circuitry and, more particularly, to circuitry and associated methods for generating a bit stream signal having a reduced output swing suitable for use in a variety of applications including, but not limited to, an automotive radar systems.

BACKGROUND

As is known in the art, there is a trend for consumer and military vehicle reliance on vehicle mounted radar systems (generally referred to as "automotive radar systems"). With respect to consumer vehicles, radar systems have been found to be particularly suitable in applications for blind spot detection, backup assist, and anti-collision warning systems. Military vehicles have also used automotive radar systems for the aforementioned applications in addition to "threat" detection.

Automotive radar system performance is affected not only by its ability to accurately detect the presence of a vehicle in a blind spot area or detect obstacles in front of a vehicle, for example, but is likewise influenced by external factors, such as its ability to integrate with vehicles, which may depend upon its associated cost, form factor, and energy usage to meet the low size, weight, and power requirements demanded by consumers and military customers alike.

Some automotive radar systems utilize a frequency modulated continuous wave (FMCW) radar technique. Some FMCW radars transmit a linear frequency chirp generated from a tuning voltage applied to a voltage variable capacitor that is part of an oscillator circuit (e.g. a VCO). The tuning voltage necessarily compensates for frequency offset, frequency slope and frequency non-linearity. This voltage comes from the digital to analog converter (DAC) which is then low pass filtered to eliminate high frequency noise. The DAC can use a conventional multi-bit DAC or a single bit DAC. The single bit DAC may convert a 32 MHz bit stream to a bit pattern (i.e. a pattern of logic 0's and 1's) that when filtered produces an analog voltage. In some systems, the single bit approach uses a simulated RC time constant as part of the logic to determine whether to generate a 1 or a 0 in the bit pattern. A bit pattern having the appropriate 1/0 history is then computed to generate the tuning voltage when played back through a bit serializer and tuning voltage filter.

One way to implement a one bit DAC is to utilize a pulse width modulator (PWM) circuit or delta sigma modulator (DSM) circuit to generate the bit stream. A comparator in the PWM circuit or DSM circuit decides whether the next bit should be 1 or 0. To generate an appropriate bit stream, it is possible to simulate feedback with a simulated RC time constant. The so-generated bit stream is stored in memory. The radar FMCW chirp generation occurs when playing back the recorded bit stream though the low pass filter.

A processor can generate a bit stream and provide the bit stream through a serial port. The bit stream is formed from a sequence of words (e.g. a sequence of N bit words). In some applications (e.g. automotive radar applications), the recorded bit stream is provided from two-hundred fifty-six (256) thirty-two (32) bit words that get loaded into a bit serializer at a predetermined rate to produce a desired bit stream. For example, the 256 32-bit words may be loaded into a bit serializer at a 1 MHz rate thereby producing a 32 MHz bit stream.

At bit stream speeds necessary for desired operation in many applications including, but not limited to automotive radar applications, a high speed driver circuit coupled between the serial port of the processor and the VCO is required to process such a bit streams and provide an appropriate signal to drive the VCO.

Such high speed driver circuitry, however, requires a substantial amount of power, a relatively large amount of physical layout space, and a specialized low impedance I/O pin on the processor to which it is coupled.

SUMMARY

Described herein is a system and technique to utilize a driver circuit which receives a bit stream and produces a signal having a reduced output swing. This allows a digital to analog converter (DAC) to produce a pulse width modulated bit stream and operate as 1 bit DAC. Such a technique finds use in a wide variety of applications including, but not limited to radar applications (including, but not limited to automotive radar applications), and audio applications (including, but not limited to audio signal processing applications).

By utilizing circuitry and associated techniques for generating a bit stream signal having low and high logic levels separated by an amount which is less than an amount found in conventional systems (i.e., by utilizing a signal having a reduced output swing), integrated circuit manufactures (i.e., chip makers) may provide integrated circuits (ICs) having relatively high speed internal logic (e.g., on the order of 200 MHz or higher internal logic). Furthermore, the one-bit DAC may be implemented via a pulse width modulator (PWM) circuit or a delta sigma modulator (DSM) circuit which occupies a relatively small amount of space on an integrated circuit. While it is relatively difficult to drive a processor output pin to full swing at high speeds (e.g., speeds on the order of 200 MHz or higher), by utilizing signals having a reduced output swing, non-specialized pins (e.g., general purpose input-output (I/O) pins) on an integrated circuit can be used even when driven with high speed signals. The reduced output swing approach, also allows incorporation of a PWM circuit or a DSM circuit into a processor (e.g., a microprocessor), since the PWM circuit and DSM circuit require relatively few gates to implement in the processor.

In automotive radar systems, the reduced output swing technique described herein enables use of an IC which includes all components, passive and active, integrated on a single semiconductor substrate. This results in an increase in the density of ICs on substrates (e.g., silicon substrates) which is desirable given the high costs associated with wafer fabrication. The density of ICs on a wafer is related to the density of transistors (e.g., driver circuits, misc. circuitry) in an IC, which is limited at least in part by the rate at which heat can be removed from the transistors. Such is related to the amount of power required by the transistors and dissipated by the transistors in the form of heat. Thus, generally the lower the amount of power required by the transistors, the less heat which is generated by the transistors and the higher the density of devices which can operate in an IC. Since the reduced output swing technique described herein allows use of low speed (and hence low power) driver circuits, the reduced output swing technique leads to a decrease in the amount of power and physical layout space required by driver circuits.

By providing a system capable of operating with a bit stream signal having a reduced output swing, the need for high power driver circuitry requiring a substantial amount of power, physical layout space, and a specialized pin (e.g., a high impedance pin) for operation is reduced and ideally avoided.

In one aspect, an automotive radar apparatus includes a bit stream modulation circuit configured to generate a full output swing bit stream signal at an output thereof. An automotive radar apparatus additionally includes a driver circuit having an input coupled to the output of the bit stream modulation circuit. The driver circuit is configured to receive the full output swing bit stream signal at the input thereof and to generate a corresponding driver bit stream signal having a reduced output swing at a driver circuit output. The automotive radar apparatus also includes a filter circuit having an input coupled to the output of the driver circuit. The filter circuit receives the driver bit stream signal at the input and provides a filtered bit stream signal at an output thereof. A voltage controlled oscillator (VCO) is coupled to receive the filtered bit stream signal from the filter circuit and in response thereto provides an RF output signal at a VCO output.

Features of the automotive radar apparatus may include one or more of the following either individually or in combination. The driver bit stream signal is provided having edge transition times that are greater than edge transition times associated with the bit stream signal provided by the bit stream modulation circuit such that the driver bit stream signal is provided having a reduced output swing. The bit stream modulation circuit, the driver circuit, and the filter circuit form at least part of a VCO tuning circuit in the automotive radar apparatus. The filtered bit stream signal generated by the filter circuit may be provided as a tuning signal. The tuning signal may be provided in the form of a tuning voltage. The bit stream modulation circuit may be provided as part of a processor. The driver circuit may be provided as part of a processor. The bit stream modulation circuit and the driver circuit may be provided in a single processor and the processor may be provided in a single integrated circuit. The filter circuit may be provided having a low-pass filter characteristic.

Features of the automotive radar apparatus may further include one or more of the following either individually or in combination. The bit stream modulation circuit may be provided having a calibration circuit coupled to receive a bit stream input signal at an input thereof and configured to adjust or modify in any way the bit stream input signal to account for non-linearity of a VCO in generating the bit stream signal (i.e., the bit stream signal can be modified so as to make the VCO appear to be a linear device). The input signal provided to the bit stream modulation circuit may be an analog signal or a digital signal. The bit stream modulation circuit may be further provided having a data buffer module coupled to receive, and/or store, and/or process the bit stream signal and adapted to couple to the driver circuit. The bit stream modulation circuit may be provided as a pulse width modulator (PWM) circuit or delta sigma modulator (DSM) circuit. The bit stream modulation circuit may also be provided having a one-bit digital-to-analog converter (DAC). The driver circuit may comprise one or more of a reduced number of transistors, an increased equivalent resistance, or a reduced die space in comparison to an alternative driver circuit configured to generate an alternative drive bit stream signal having edge transition times that are substantially equal to edge transition times associated with the bit stream signal (e.g., the alternative driver circuit may have an equivalent resistance or output impedance of 10 ohms, which requires significant die space, while the driver circuit may have an equivalent resistance or output impedance of 200 ohms, which requires less die space than the alternative driver circuit).

In another aspect, a method of driving a voltage controlled oscillator (VCO) includes generating a bit stream signal, receiving the bit stream signal in a driver circuit, and in response to the bit stream signal generating a driver bit stream signal having an output swing which is reduced compared with the output swing of the bit stream signal. The method additionally includes filtering the driver bit stream signal and generating a tuning signal from the filtered driver bit stream signal. The method also includes providing the tuning signal to an input of a VCO and generating an RF signal at an output of the VCO wherein the frequency to the RF signal is proportional to the value of the tuning signal provided to the VCO input from said tuning signal.

In other embodiments, generating a driver bit stream signal having a reduced output swing from a bit stream signal includes generating a driver bit stream signal having edge transition times that are greater than edge transition times associated with the bit stream signal such that the driver bit stream signal is provided having a reduced output swing. In another embodiment, generating a bit stream signal includes receiving a bit stream input signal, tuning the bit stream input signal to account for non-linearity of the VCO, and generating a bit stream signal from said tuned bit stream input signal. In yet another embodiment, generating a bit stream signal further includes providing the bit stream signal to an input of a driver circuit. In another embodiment, providing the bit stream signal to an input of a driver circuit includes storing the bit stream signal in a data buffer, shifting data stored in the bit stream signal in accordance with a desired bit stream to produce a shifted bit stream signal, and providing the shifted bit stream signal to an input of a driver circuit.

BRIEF DESCRIPTION OF THE DRAWINGS

The foregoing features of the disclosure, as well as the disclosure itself may be more fully understood from the following detailed description of the drawings in which:

FIG. 3 is a block diagram of example circuitry including a bit stream modulation circuit coupled to a low speed driver circuit and a filter circuit;

FIG. 3A is a block diagram of example circuitry in accordance with another embodiment including a bit stream modulation circuit coupled to a low speed driver circuit and a filter circuit;

DETAILED DESCRIPTION

Figure 1:
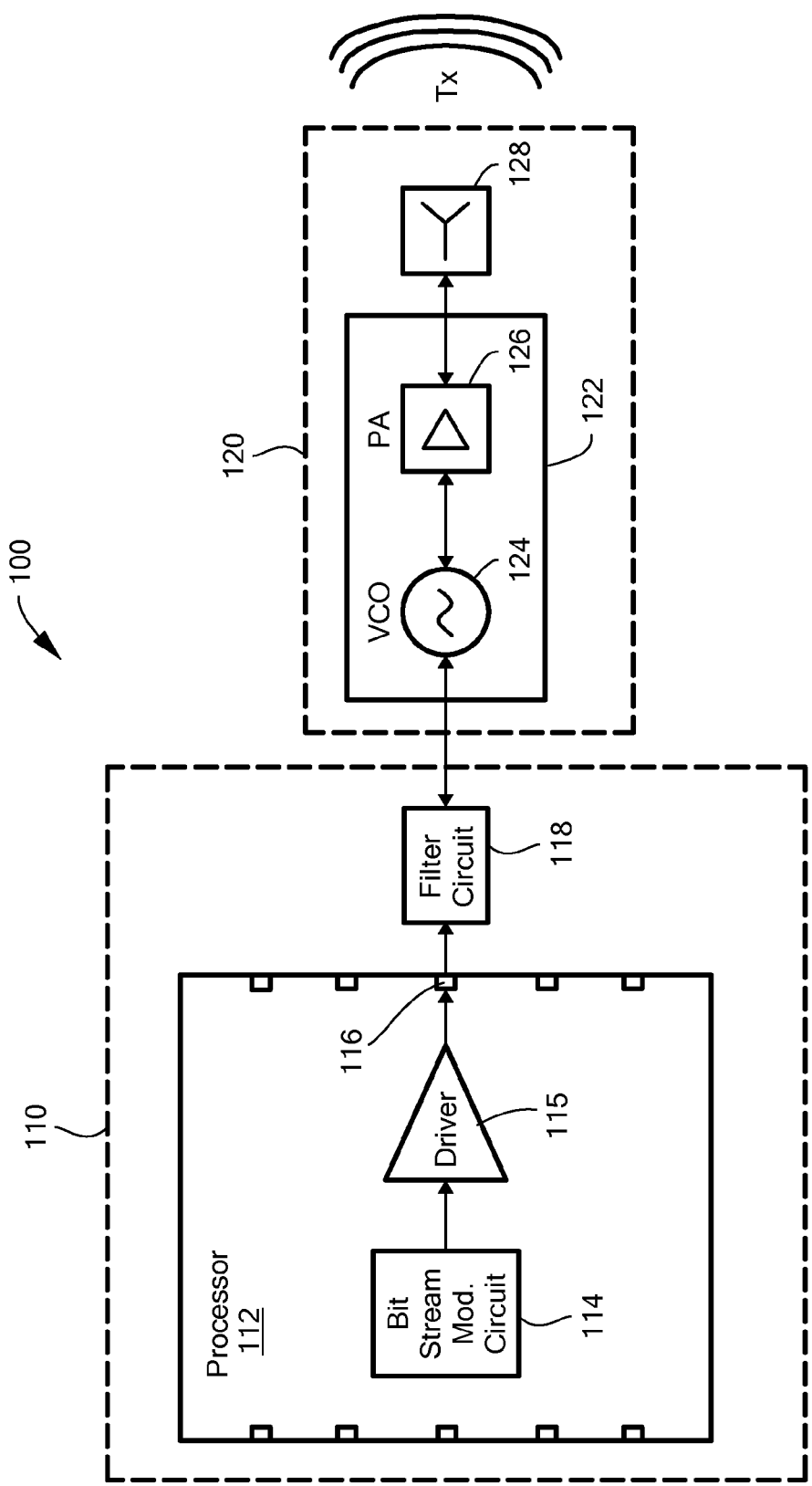
FIG. 1 is a block diagram of an example automotive radar apparatus including a bit stream modulation circuit, a driver circuit which provides a signal having a reduced output swing, and a filter circuit coupled to a voltage controlled oscillator (VCO) for generating an RF output signal.

The features and other details of the concepts, systems, circuits and techniques sought to be protected herein will now be more particularly described. It will be understood that any specific embodiments described herein are shown by way of illustration and not as limitations of the disclosure. For example, reference is made herein to an automotive radar system which operates using signals having a reduced output swing. It should be understood that such a reduced output swing technique finds use in a wide variety of applications including, but not limited to other radar applications (i.e., radar applications including, but not limited to, automotive radar applications), audio signal processing applications and substantially any application where a semiconductor chip manufacturer desires to include a high-speed, high-performance pulse width modulator (PWM) circuit or delta-sigma modulator (DSM) circuit (i.e., a PWM or DSM circuit capable of producing a bit stream signal with "fast" edge transition times, e.g., less than 1 ns) or an equivalent thereof on a semiconductor chip. A "fast" edge transition time enables the bit stream signal to move from a low of about ten percent to a high of about ninety percent (i.e., a low to high transition) of the minimum and maximum voltage levels of the bit stream signal, effectively producing a full swing signal. For a 200 MHz digital waveform of a bit stream signal having a 5 ns cycle time for a low to high transition (and a high to low transition), for example, the edge transition time conventionally needs to be less than about 1 ns (measured at the low and high points) for the waveform to look "square", as is desirable (i.e., edge transition times should generally be less than 10-20% of the cycle time). In contrast, a 200 MHz digital waveform of a bit stream having a 5 ns edge transition time will produce a reduced output swing (which may be about half of the low to high transition of the full swing signal).

The principal features of this disclosure can be employed in various embodiments without departing from the spirit and scope of the concepts, systems, circuits and techniques sought to be protected. The preferred embodiments of the present disclosure and associated advantages are best understood by referring to the drawings, like numerals being used for like and corresponding parts of the various drawings.

DEFINITIONS

For convenience, certain introductory concepts and terms used in the specification are collected here.

As used herein, the term "rise time" is used to describe the time taken by a signal to increase (rise) from a specified low value to a specified high value. Thus, when reference is made herein to a "fast" rise time, this refers to a rise time which is a short period of time over which a signal transitions from a specified low value to a specified high value (i.e., the phrases "fast rise time" and "short rise time" are equivalent). Edge transition time (or edge speed) is often specified as a time to transition between about ten percent and about ninety percent of a full voltage swing of a signal. Accordingly, a signal having a "fast rise time" will generally having a short edge transition time. Conventionally, logic circuitry receiving a signal, for example, is interested in how fast a signal moves between a digital "0" (as recognized by the logic circuitry) and a digital "1" (as recognized by the logic circuitry) or vice versa.

As used herein, the term "fall time" is used to describe the time taken by a signal to decrease (fall) from a specified high value to a specified low value. Thus, when reference is made herein to a "fast" fall time, this refers to a fall time which is a short period of time over which a signal transitions from a specified high value to a specified low value (i.e., the phrases "fast fall time" and "short fall time" are equivalent).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can be embodied in a microprocessor with associated program memory. Furthermore, in some embodiments the "processor" can be embodied in a discrete electronic circuit, which can be analog, digital, or a combination thereof.

As used herein, the term "module" may be used to describe analog or digital circuitry (or a circuit provided from a combination of analog and digital circuitry) or a processor.

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "substrate" refers to any structure upon which an integrated circuit or semiconductor device can be disposed or upon which semiconductor materials can be deposited and/or into which semiconductor materials can be implanted and diffused. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

Referring now to FIG. 1, a portion of a transmitter apparatus 100 includes pulse signal generation circuitry 110 coupled to radio frequency (RF) signal generation and transmission circuitry 120. The transmitter apparatus 100 may be used in an automotive radar apparatus, for example, such as the types described in any of U.S. Pat. Nos. 6,107,956; 6,864,831; 6,816,107; and 6,707,419 all of which are assigned to the assignee of the present application and incorporated herein by reference in their entireties. The pulse signal generation circuitry 110 includes a processor 112, a bit stream modulation circuit 114, a driver circuit 115, and a filter circuit 118. In this example embodiment, the bit stream modulation circuit 114 and the driver circuit 115 are shown as part of the processor 112 and the filter circuit 118 is shown as separate from the processor 112. It should, of course, be appreciated that in other embodiments the bit stream modulation circuit 114 and the driver circuit 115 may not be a part of the processor 112. In some embodiments, the processor 112 may be provided in a single integrated circuit (IC) or from multiple IC's disposed on a common substrate.

The bit stream modulation circuit 114 receives chirp control signals at an input from the processor 112 and in response thereto generates a bit stream signal at an output thereof. The bit stream signal is provided to an input of the driver circuit 115 which is coupled to the bit stream modulation circuit output. In one embodiment, the bit stream signal is formed by signals having a logic low signal level (nominally 0 volts (V) and sometimes referred to as a logic 0) and signals having a logic high signal level (nominally 5V and sometimes referred to as a logic 1). The conventional voltage swing between 0V and 5V values (i.e., from logic low to logic high) is referred to herein as a full output swing.

As is known, a bit stream signal is typically provided having characteristics which allow the bit stream signal to be presented to subsequent circuitry in a form appropriate for use by the subsequent circuitry. In this embodiment, it is desired to provide the bit stream signal, which in some applications has a high bit stream rate (e.g., 200 MHz, 400 MHz, etc.), to an input of the driver circuit 115.

Conventionally, it has been thought that a driver circuit (e.g., driver circuit 115) needs to have an operating characteristic (e.g., ability to achieve full swing at the native clock rate) which is substantially the same as or similar to the bit stream rate (i.e., the high bit stream rate in some applications) of the bit stream signal in order to suitably process such bit stream signal. While it is possible to provide a driver circuit having such operating characteristic (referred to as high speed driver circuits), such high speed driver circuits are relatively expensive in terms of the amount of power they consume as well as the amount of physical space required on an IC. As a result, the driver circuit is generally provided external to the processor 112 for reasons apparent.

In accordance with the concepts sought to be protected herein, it has been recognized that a driver circuit having an operating characteristic (e.g., full swing native clock rate, interface speed, or nominal DAC speed) which is relatively slow (e.g., 10-20 times slower) compared with the bit stream rate of a bit stream signal (or pulse train) being provided thereto may suitably be used. For example, it has been recognized that a low speed driver circuit supporting a clock rate which is relatively slow (e.g., 10 MHz or 32 MHz) can be used to receive a bit stream signal having a substantially greater bit stream rate (e.g., 200 MHz or 400 MHz). Such a low speed driver circuit has the advantages of requiring less power, less complexity and less space compared with a high speed driver circuit that would conventionally be used.

In the embodiment shown, the driver circuit 115, which is provided as a low speed driver circuit, has an input coupled to the bit stream modulation circuit output. The driver circuit receives the bit stream signal and in response thereto generates a corresponding driver bit stream signal at an output thereof. In one embodiment, the bit stream signal is provided having a full output swing and the corresponding driver bit stream signal is provided having a reduced output swing (as illustrated and described in conjunction with FIG. 4A below). Since driver circuit 115 is selected having an operating characteristic that supports a substantially lower bit stream rate than the bit stream rate of the bit stream signal provided thereto, it produces a driver bit stream signal having edge transition times that are greater than edge transition times associated with the bit stream signal provided to the input thereof (e.g., provided to the driver circuit input by the bit stream modulation circuit 114). Consequently, the driver bit stream signal is provided having an output swing (in this example an output voltage swing) which is reduced in comparison with the output swing of the bit stream signal provided thereto. Advantages associated with the driver bit stream signal having a reduced output swing will be apparent from the discussions of FIGS. 3-5 discussed herein below.

An output of driver circuit 115 is coupled to an output pin 116, which may be standard processor output pin or may correspond to a relatively high impedance pin of the processor. In this example embodiment, output pin 116 is coupled to an input of the filter circuit 118.

The filter circuit 118 receives the driver bit stream signal (i.e., the driver bit stream signal having a reduced output swing—here, a voltage pulse signal) at the input thereof. In response thereto, the filter circuit 118 appropriately processes the driver bit stream signal (e.g., filters the driver bit stream signal to remove undesirable frequency components) and generates a filtered bit stream signal at an output thereof. In some embodiments, the bit stream modulation circuit 114, the driver circuit 115, and the filter circuit 118 form at least part of a VCO tuning circuit and, in such embodiments, the filtered bit stream signal may be provided as a tuning signal. In one embodiment, the tuning signal is provided in the form of a Tune Voltage.

The RF signal generating and transmission circuitry 120, which includes RF transmitter circuitry 122 and an antenna 128, has an input coupled to the filter circuit output. The RF transmitter circuitry 122, which includes a VCO 124 and a power amplifier 126, has an input coupled to the RF signal generating and transmission circuitry 120. The VCO 124 receives the filtered signal (or tuning signal) at a VCO input and in response thereto generates an RF output signal at an output thereof.

The power amplifier 126 has an input coupled to the VCO output. The power amplifier 126 receives the RF output signal at the input thereof and in response thereto generates an amplified RF output signal. The amplified RF output signal is provided to an input of a transducer which in this example embodiment corresponds to an RF antenna 128.

The RF antenna 128 receives the amplified RF output signal at an RF antenna input and in response thereto emits the RF signal into a transmission medium (here, free space) as a transmitted signal Tx. The transmitted signal Tx can, for example, be transmitted to detect a presence of an object (e.g., as a vehicle or "threat"), with reflected portions of the transmitted signal Tx being received by a receiver (not shown), and used to find a position of an object relative to the apparatus 100 as is generally known. In such embodiments, the automotive radar apparatus 100 further includes appropriate receiver circuitry for receiving and processing the reflected portions of the transmitted signal Tx. In some embodiments, the transmitter 128 includes a plurality of transmit antennas. Having a plurality of transmit antennas may, for example, be desirable for transmitting the transmit signal Tx at a substantially greater beam width than may be possible with a single transmit antenna.

In operation, the processor 112 initializes the automotive radar apparatus 100, generates chirp control signals for detecting the presence of an object (e.g., vehicle or "threat"), and/or provides signals to other vehicle systems (e.g., object warning systems, collision warning and avoidance systems, etc.). Initialization of radar systems is conventional in the art and, therefore, is not described in detail herein. The chirp control signals establish a desired RF output signal to be generated by the VCO. The chirp control signals can also be used to generate a VCO tuning signal (also referred to herein as a tuning signal) having a ramp shape provided to an input of the VCO 124. Processor 112 may respond to an external control signal (not shown) for controlling the characteristics of a VCO tuning signal.

As noted above, the bit stream modulation circuit 114 receives the chirp control signals at the bit stream modulation circuit input and in response thereto generates a bit stream signal at an output thereof. In some embodiments, the bit stream modulation circuit may be provided from a pulse width modulator (PWM) circuit or a delta sigma modulator (DSM) circuit in the processor 112, but it is not so limited.

A filter circuit 117 receives the driver bit stream signal at a filter circuit input and generates a filtered bit stream signal in response thereto at a filter circuit output. The filter circuit may be implemented as an active or passive filter. Additionally, in some embodiments, the filter circuit is provided as a filtering device having a low-pass filter characteristic for attenuating portions of the driver bit stream signal that are outside of a desired frequency passband which are representative of harmonics (e.g., first, second, and higher harmonics). A filtering device having a low-pass filter characteristic can, for example, reduce a residual output swing associated with the driver bit stream signal received by the filter circuit. As discussed above, in some embodiments, the filtered bit stream signal may be provided as a tuning signal and, in one embodiment, the tuning signal is provided in the form of a tuning voltage. The tuning signal can, for example, be used to control the VCO 124 and compensate for non-linear characteristics of the VCO 124 as described for example in the aforementioned U.S. Pat. Nos. 6,707,419, 6,816,107, 6,864,831. Additionally, in some embodiments the processor 112 may be provided in a single integrated circuit (IC) or from multiple IC's disposed on a common substrate.

It is also to be appreciated that the bit stream modulation circuit 114, the driver circuit 115, the filter circuit 118, and/or the VCO 124 may be embodied as hardware, software, firmware, or any combination thereof. For instance, one or more memories and processors may be configured to store and execute, respectively, various software programs or modules to perform the various functions encoding and/or decoding techniques described herein. For example, in certain embodiments, such may be implemented in a field-programmable gate array (FPGA), and may be capable of achieving successful communication for high data rates. Alternatively, such may be implemented via an application specific integrated circuit (ASIC) or a digital signal processor (DSP) circuit or via another type of processor or processing device or system.

Additional aspects of the concepts, systems, circuits and techniques described herein will be apparent from the subsequent figures.

Figure 2:
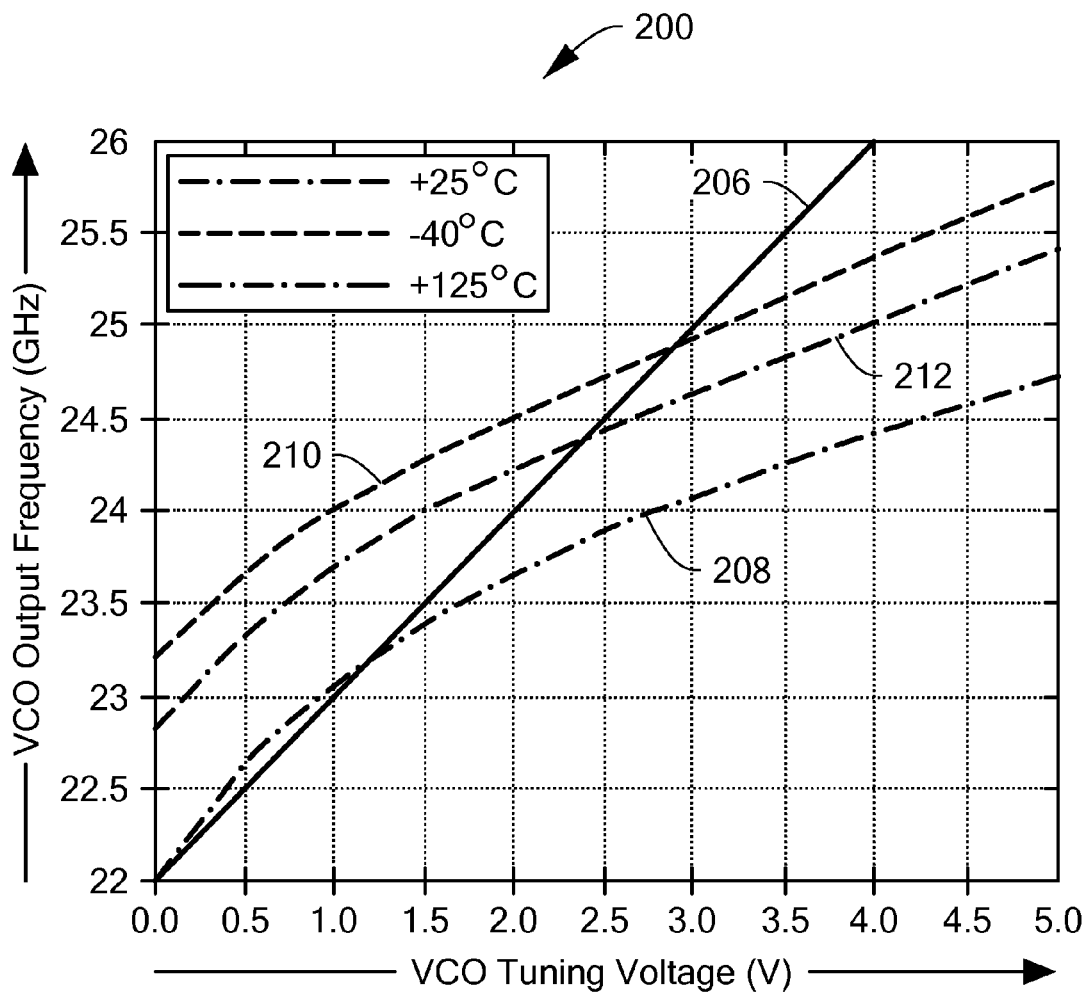
FIG. 2 is a plot of VCO RF output signal frequency vs. tuning voltage for a conventional VCO which may be the same as or similar to the VCO of FIG. 1.

Referring now to FIG. 2, a plot 200 of VCO RF output signal frequency vs. VCO tuning voltage is shown. The horizontal axis corresponds to VCO tuning voltage (or tuning signal) levels (generated by a VCO tuning circuit, for example, which can include circuitry that is the same as or similar to the bit stream modulation circuit 114, the driver circuit 115, and/or the filter circuit 118 of FIG. 1), and received by a VCO, which can be the same as or similar to VCO 124 of FIG. 1. The vertical axis corresponds to VCO RF output signal frequency (e.g., RF output signals generated by the VCO in response to the received VCO tuning voltage) at three different temperatures designated by curves 208, 210, 212.

As is known in the art, an ideal VCO is a device configured to generate output signals (e.g., RF output signals) with an oscillating frequency that is a linear function of a received input voltage (e.g., VCO tuning voltage) as illustrated by ideal curve 206. However, practical VCO's are non-linear devices and may vary in response a variety of characteristics including, but not limited to, external characteristics. For example, curves 208-212 illustrate non-linear characteristics of a VCO due to changes in temperature. In particular, and as illustrated by curve 208 for example, the VCO signal frequency is not linearly proportional to the VCO tuning voltage. A consequence is, without correction, in response to a particular VCO tuning voltage provided to an input of the VCO, the RF output signal generated by the VCO (e.g., VCO 124, shown in FIG. 1) will not be at an expected frequency. Consequently without correction, signals generated by the VCO and subsequently amplified by a power amplifier (e.g., 126, shown in FIG. 1), and emitted by an antenna (e.g., 128, shown in FIG. 1) as a transmitted signal Tx, are not transmitted at an expected frequency. Further, due to temperature variation (e.g. as illustrated by curves 208, 210, 212) a single VCO tuning voltage can result in signals at a multitude of different frequencies as a result of changes in temperature. VCO signal frequency variation can also occur simply with changes in time.

As apparent, such VCO non-linearity is undesirable. For example, the instantaneous frequency difference between the transmitted signal Tx and a returned signal (not shown) can be indicative of a distance between the transmitter (e.g., 128, shown in FIG. 1) and an object (e.g., vehicle or "threat"). A function of the transmitted signal Tx being transmitted at a multitude of frequencies is the returned signal (not shown) may also return at a multitude of frequencies. The transmit frequency errors can result in range error and inaccurate detection of the object, reducing the usefulness of a radar apparatus comprising a VCO. Additional problems resulting from VCO non-linearity will be appreciated.

As is known in the art, in order for a radar system comprising a VCO to accurately measure the range to an object (e.g., vehicle or "threat"), the VCO's non-linearity should be taken into account. In some embodiments, the characteristic of the VCO tuning voltage (horizontal axis) is curved to compensate for the VCO's non-linearity. In one embodiment, this is accomplished through use of a VCO tuning signal generated by a VCO tuning circuit (which may include one or more of the bit stream modulation circuit 114, the driver circuit 115, and the filter circuit 118 of FIG. 1).

Returning briefly to FIG. 1, as apparent from the automotive radar apparatus 100, a VCO tuning signal, which is some instances is substantially the same as or similar to the filtered bit stream signal (not shown) generated by the filter circuit 118, is functionally related to the driver bit stream signal (not shown) generated by the driver circuit 116 and the bit stream signal (not shown) generated by the bit stream modulation circuit 114. Therefore, bit stream modulation circuit, driver circuit, and filter circuit design consideration are important in appropriately tuning a VCO.

With the trend of integrated circuit components being scaled down in size and, as a consequence, the speed of silicon circuits increasing, it is becoming increasingly important to adapt designs to high speed internal logic and lower speed interfaces to external logic. External pin drivers require larger size (lower impedance and faster edge rates) to achieve high performance, so the trend to faster logic requires larger drivers to keep up with the speed. Compounding the problem, the larger higher speed drivers displace even more functionality of the smaller fast internal logic. Shown in FIGS. 3 and 3A are example implementations of bit stream modulation circuits and driver circuits capable of decreasing the complexity and thus spacing requirements typically associated with bit stream modulation circuits (e.g., 114, shown in FIG. 1) and driver circuits (e.g., 116, shown in FIG. 1) without compromising performance needed to generate a filtered bit stream signal (or VCO tuning signal) for compensating for VCO non-linearity, as discussed above.

Referring now to FIG. 3, example circuitry 300 includes a bit stream modulation circuit 310, a low speed driver circuit 320 and a filter circuit 330 coupled as shown. In the example embodiment shown, low speed driver circuit 320 (also referred to herein as driver 320) and filter circuit 330 are not properly a part of the bit stream modulation circuit 310 and thus are shown in phantom. It should, of course, be appreciated that in other embodiments bit stream modulation circuit 310, driver 320 and filter circuit 330 may be integrated within a single circuit (e.g. a single integrated circuit) and it should also be appreciated that the functionality provided by each of bit stream modulation circuit 310, driver 320 and filter circuit 330 may be shared or split in a manner other than as illustrated in FIG. 3. Additionally, in the example embodiment shown, the bit stream modulation circuit 310 and driver 320 are provided as part of a processor (e.g., processor 112 in FIG. 1). The processor includes a pin 325, which may be the same as or similar to pin 116 of processor 112 of FIG. 1.

The bit stream modulation circuit 310, which can be the same as or similar to bit stream modulation circuit 114 described above in conjunction with FIG. 1, is shown as a generic bit stream modulation circuit in the embodiment shown. In one embodiment, the bit stream modulation 310 may be provided as a delta sigma modulator (DSM) circuit. In another embodiment, the bit stream modulation circuit 310 may be provided as a pulse width modulator (PWM) circuit. The bit stream modulation circuit 310 receives chirp control signals 310 at an input from other portions of the processor. The chirp control signals 310a can, for example, be received in either digital form (e.g., a sequence of words) or analog form (e.g., an analog signal representative of a sequence of words). It will appreciated that in some embodiments the processor (not shown) may alternately provide a chirp control signal in digital form to a converter which, in turn, provides a chirp control signal in analog form to the bit stream modulation circuit input. Operation of bit stream modulation circuits (e.g., bit stream modulation circuit 310) is conventional in the art and, therefore, is not described in detail herein.

The bit stream modulation circuit 310, in response to receiving the chirp control signals 310a, generates a bit stream signal 310b at an output thereof. In one embodiment, the chirp control signals 310a are received at a first frequency (e.g., 1 MHz) and the bit stream signal 310b is provided at a second, higher frequency (e.g., 200 MHz). According to some embodiments, the bit stream signal 310b is provided as a one-bit serial signal. A digital "high" or "low" in the bit stream signal 310b, or an equivalent thereof represents the highest (or lowest) digital bit stream signal 310b value, respectively.

The driver circuit 320 has an input coupled to the output of the bit stream modulation circuit 310. The driver circuit 320 is provided having an operating speed which is less than the operating speed which would conventionally be selected to process pulses at a speed generated by a bit stream modulation circuit (e.g., 114, shown in FIG. 1). Thus, driver circuit 320 is referred to as a "low" speed (or "low" power) driver circuit.

In response to the bit stream signal provided thereto, driver circuit 320 generates a corresponding driver bit stream signal 320b (e.g., 420, shown in FIG. 4A) having a reduced output swing at the low speed driver output. The characteristics of the driver circuit 320 are such that pulses in the driver bit stream signal 320b (e.g., 420, shown in FIG. 4A) are provided having edge transition times that are greater than edge transition times associated with the bit stream signal 310b (e.g., 410, shown in FIG. 4). Consequently, pulses in the driver bit stream signal 320b are provided having an output swing which is reduced compared with an ideal output swing from a driver circuit. The reduced output swing will be discussed further in conjunction with FIGS. 4 and 4A. It is to be appreciated that the driver bit stream signal 320b need not be symmetric.

In the embodiment shown, the driver bit stream signal 320b (e.g., 420, shown in FIG. 4A) is provided to a pin 325 of the processor. Pin 325 may, for example, be an existing general purpose input-output (I/O) pin (i.e., a pin intended for low speed applications, using small transistors and having slower edge speeds) of the processor. As such, the embodiment shown is capable of using an existing general purpose pin for a high speed application that the general purpose pin would normally not be used for (i.e., it spares the use of high impedance, high speed pins). In some embodiments, the pin 325 is designed to drive external circuitry (e.g., filter circuit 330) and has a drive capability designed to match the speed of the signal being received by the pin 325 (e.g., driver bit stream signal 320b) and the load of the external circuitry (e.g., filter circuit 330). The drive impedance of pin 325 is traditionally designed to meet the full voltage swing (e.g., digital voltage swing) of the driver bit stream signal 320b at a desired design speed and load (e.g., filter circuit 330).

The filter circuit 330, which according to some embodiments is a filtering device having a low-pass filter characteristic and can be provided as an active or passive filter, has an input coupled to the pin 325. The filter circuit 330 receives the driver bit stream signal 320b (e.g., 420, shown in FIG. 4A) and in response thereto generates a filtered bit stream signal 330b at the filter circuit output. The filter circuit 330 can, for example, be implemented using resistors, capacitors and operational amplifiers. The filtered bit stream signal 330b, which dithers around a voltage midpoint value which gives rise to a filtered bit stream signal 330b having a reduced output swing as desired, is generally received by a VCO (not shown) which can be the same as or similar to VCO 124 of FIG. 1. In some embodiments, the bit stream modulation circuit 310, the driver 320 and filter circuit 330 form at least part of a VCO tuning circuit. In such embodiments, the filtered bit stream signal 330b may be provided as a tuning signal (e.g., for tuning a VCO).

In the example circuitry 300 shown in FIG. 3, the bit stream modulation circuit 310 and driver 320 are described as being part of the processor (not shown). It is to be appreciated, however, that in some embodiments the bit stream modulation circuit 310, driver 320, and/or filter circuit 330 may be provided as part of the processor (e.g., may be fabricated as part of the processor) or be separate from the processor. Additionally, in some embodiments, the bit stream modulation circuit 310 and driver 320 may be provided in a single processor. In some embodiments, this single processor is provided in a single integrated circuit. In other embodiments, the bit stream modulation circuit 310 and the driver 320 are provided in a single processor arranged over a common substrate.

Referring now to FIG. 3A, example circuitry 340 in accordance with another example embodiment includes a bit stream modulation circuit 350, a low speed driver circuit 360 and a filter circuit 370 coupled as shown. In this example embodiment, like the example embodiment shown in FIG. 3, low speed driver circuit 360 (also referred to herein as driver 360) and filter circuit 370 are not properly a part of the bit stream modulation circuit 350 and thus are shown in phantom. Additionally, like the example embodiment shown in FIG. 3, it should be appreciated that in other embodiments bit stream modulation circuit 350, driver 360 and filter circuit 370, may be integrated within a single circuit (e.g., a single integrated circuit) and it should also be appreciated that the functionality provided by each of bit stream modulation circuit 350, driver 360 and filter circuit 370 may be shared or split in a manner other than as illustrated in FIG. 3. Furthermore, like the example embodiment shown in FIG. 3, the bit stream modulation circuit 350 and driver 360 are provided as part of a processor (e.g., processor 112 in FIG. 1). The driver 360 is shown having an output coupled to a pin 365, which can be the same as or similar to pin 325 of FIG. 3 and/or pin 116 of FIG. 1.

The bit stream modulation circuit 350 can be the same as or similar to bit stream modulation circuit 114 shown in FIG. 1. In this example embodiment, the bit stream modulation circuit 350 receives chirp control signals (which sets the VCO tuning voltage of the VCO, e.g., VCO 124 of FIG. 1, to a correct, linearity compensated value) 350a, which can be the same as or similar to the chirp control signals 310a shown in FIG. 3, at an input from other parts of the processor of which they are a part. The bit stream modulation circuit 350 comprises a VCO tuning voltage calibration process 352 (which may be in the form of software, firmware, or hardware or any combination thereof), a random access memory (RAM) buffer 354, and a shifter (or shift register) 356.

The VCO tuning calibration process 352 receives the chirp control signals 350a and in response thereto tunes the chirp control signals 350a in accordance with a desired technique and generates tuned chirp control signals 350a at an output thereof.

The RAM buffer 354 has an input operatively coupled to the output of the VCO Tuning Calibration Software 352. The RAM buffer 354 receives the tuned chirp control signals 350a at the RAM buffer input and in response thereto stores the tuned chirp control signals 350a, values associated with the filter circuit 370, and other signals or values as will be apparent. In some embodiments, the bit stream modulation circuit 350 and/or the processor comprising the circuitry 340 may also be operatively connected to a program read-only memory (ROM) and/or an electrically erasable programmable read only memory (EEPROM). The program ROM can, for example, contain software instructions used by the processor to control the automotive radar apparatus 100 of FIG. 1. It will be appreciated that the appropriate memories may also be internal to the processor.

The shifter 356 has a first input ("data input") coupled to the output of RAM buffer 354 and a second input ("clock input", not shown) coupled to a clock (not shown), which may be provided in the bit stream modulation circuit 350 in some embodiments or external to the bit stream modulation circuit 350 but internal to the processor in other embodiments. The shifter 356 receives the tuned chirp control signals, values associated with the filter circuit 370, and other signals or values from the RAM buffer 354 and in response thereto generates shifted data at the shifter output. The shifted data is delayed by "n" discrete clock cycles, where "n" is the number of shift register stages included in the shifter 356.

An output of the bit stream modulation circuit 350 is coupled to the shifter output. The bit stream modulation circuit 350 output receives the shifted data and in response thereto generates a bit stream signal 350b, which can be the same as or similar to the shifted data.

The driver 360 has an input coupled to the output of the bit stream modulation circuit 350. The driver 360, which is representative of a "low" speed driver circuit and can be the same as or similar to driver 320 of FIG. 3, receives the bit stream signal 350b and in response thereto generates a corresponding driver bit stream signal 360b (e.g., 420, shown in FIG. 4A) having a reduced output swing at the low speed driver output. The driver bit stream signal 360b can be the same as or similar to driver bit stream signal 320b described in FIG. 3.

In the embodiment shown, the driver bit stream signal 360b (e.g., 420, shown in FIG. 4A) is provided to the pin 365. The pin 365, which is shown coupled to an input of the filter circuit 370, which can be the same as or similar to filter circuit 330 of FIG. 3, provides the driver bit stream signal 360b (e.g., 420, shown in FIG. 4A) to the filter circuit input. The filter circuit 370 receives the driver bit stream signal 360b (e.g., 420, shown in FIG. 4A) and in response thereto generates a filtered bit stream signal 370b at the filter circuit output. In some embodiments, the bit stream modulation circuit 350, the driver 360 and filter circuit 370 form at least part of a VCO tuning circuit. In such embodiments, the filtered bit stream signal 370b may be provided as a tuning signal.

Figure 4:
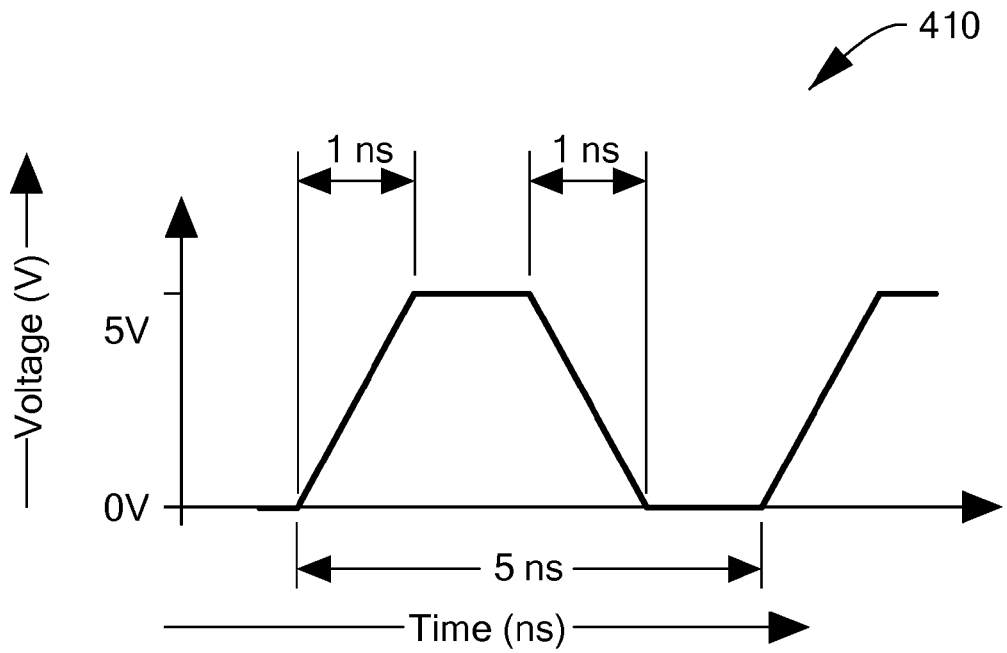
FIG. 4 is a plot of voltage vs. time illustrating a prior art output voltage swing waveform for a single bit of a bit stream signal.
Figure 4A:
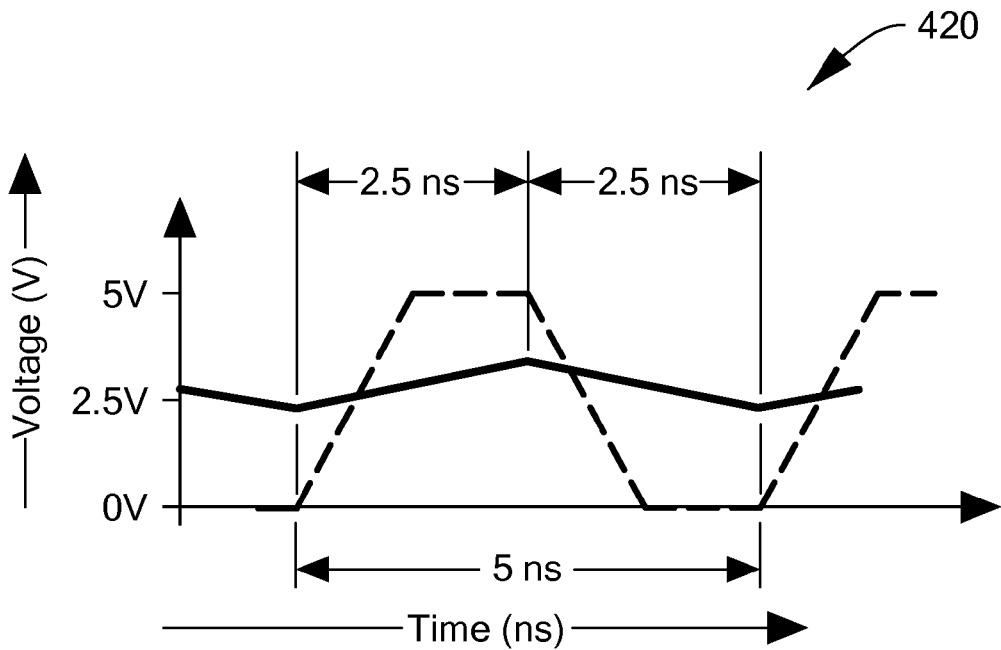
FIG. 4A is a plot of voltage vs. time illustrating a reduced output voltage swing waveform for a single bit of a bit stream signal.

Referring now to FIG. 4, a plot of voltage vs. time per pulses in a bit stream signal has a horizontal axis with a scale in time units of nanoseconds (ns) and a vertical axis with a scale in potential units of volts (V). It is to be appreciated that although units are shown in FIGS. 4 and 4A (figure below), FIGS. 4 and 4A are used for illustration purposes and may not be drawn to scale. Curve 410 represents a prior art waveform for a single bit (or pulse) of a bit stream signal (here, an approximately 200 MHz bit stream signal) generated by a driver circuit for reception by a filter circuit which may be the same as or similar to filter circuit 118 of FIG. 1. The prior art curve (or waveform) 410 can, for example, be representative of a single bit of a bit stream signal (e.g., driver bit stream signal) generated by a "high" speed (or "high" power) driver circuit (not shown) which follows a bit stream modulator circuit (e.g., 310 of FIG. 3). As illustrated, the prior art waveform 410 comprises fast rise/fall times (i.e., sharp transitions) from logic low bit levels (0's) to logic high bit levels (1's) and vice versa. In the example embodiment shown, the prior art waveform 410 has a period of about 5 ns and rise/fall times of about 1 ns from a minimum signal voltage of about 0 V to a maximum signal voltage of about 5 V and vice versa. Conventionally, the bit stream signal (e.g., driver bit stream signal) is received by a filter circuit. The filter circuit typically receives the bit stream signal at an input and in response thereto generates an average voltage based on the time history of 1/0 values in the bit stream signal. The design of the filter circuit is generally a complex tradeoff in filter complexity vs. bit stream signal patterns, bit stream clock rate, and analog voltage response time and the like. Filter design is conventional in the art and, therefore, is not described in detail herein.

Traditionally, it has been suggested that the waveform for a single bit of a bit stream signal (e.g., driver bit stream signal) generated by a driver circuit should have edge transition times that are substantially the same as edge transitions times associated with a bit stream signal received by the driver circuit (e.g., bit stream signal). As explained below, this generally requires the use of a driver circuit that is capable of reproducing the same edge transitions times associated with the bit stream signal and thus able to reproduce the bit stream signal accurately (i.e., a "high speed" driver circuit). As is known in the art, high speed driver circuits generally require a substantial amount of power, physical layout space, and use of a specialized pin on a processor for operation, which is undesirable. A result of the foregoing is manufacturers are unable to include high speed driver circuits on the same integrated circuit as a processor, which provides for a larger and more expensive circuit arrangement. In the example circuitry described herein, for example, this may require that the driver circuit (e.g., 115 of FIG. 1) be on a separate circuit than the processor (e.g., 112 of FIG. 1) comprising the bit stream modulation circuit (e.g., 114 of FIG. 1), which is undesirable for reasons apparent.

Referring now to FIG. 4A, a plot of voltage vs. time per pulses in a bit stream signal has a horizontal axis with a scale in time units of nanoseconds (ns) and a vertical axis with a scale in potential units of volts (V). Curve 420, which shown as a solid line, represents a waveform (having a reduced output swing in accordance with the embodiments disclosed herein) for a single bit (or pulse) of a bit stream signal (here, an approximately 200 MHz bit stream signal) generated by a driver circuit for reception by a filter circuit which may be the same as or similar to filter circuit 118 of FIG. 1. The curve (or waveform) 420 can, for example, be representative of a single bit of a bit stream signal (e.g., driver bit stream signal) generated by a "low" speed (or "low" power) driver circuit (not shown), which can be the same as or similar to driver 360 shown in FIG. 3A. The curve shown in phantom, which is not a part of curve 420, is representative of the prior art waveform 410 of FIG. 4 and is shown for illustration purposes. As illustrated, the waveform 420 comprises slow rise/fall times (i.e., more gradual transitions from logic low bit levels ("0s") to logic high bit levels ("1s") and vice versa than the prior art waveform shown in plot 410 of FIG. 4). In the example embodiment shown, the waveform 420 has a period of about ns and expected rise/fall times of about 20 ns from a minimum signal voltage of about 0 V to a maximum signal voltage of about 5 V and vice versa. In one embodiment, as illustrated in FIG. 4A, the waveform 420 will not have enough time to transition between the minimum signal voltage and the maximum signal voltage (i.e., will not have enough time to perform a full swing) as a result of the slow rise/fall times. In such embodiment, the waveform 420 may, for example, only swing from about 2.3 V to about 2.9 V (i.e., a portion of the transition from the minimum signal voltage to the maximum signal voltage, here an approximately 2.5 ns portion). Curve (or waveform) 420 will not comprise the same harmonics as curve (or waveform) 410 (due to the more gradual edge transitions). Effectively, a first portion of the filter circuit (e.g., an input of the filter circuit) becomes a slow edge transition design of the driver circuit. Such changes the design requirements generally associated with the filter circuit, with one benefit being reducing requirements on the filter circuit for attenuation of high frequency components of the bit stream signal (e.g., driver bit stream signal).

In accordance with the concepts, systems, circuits and techniques sought to be protected herein, it has been recognized that in many applications (e.g., radar transmitter circuits) the waveform pulses which constitute a bit stream signal generated by a driver circuit need not have edge transition times that are substantially the same as edge transitions times associated with a bit stream signal received by the driver circuit. Rather, in accordance with the concepts described herein, it has been recognized that the edge transitions times associated with the driver output waveform pulse can, for example, be greater than the edge transitions times associated with a bit stream signal received by the driver circuit.

One reason for the foregoing is the driver output signal waveform is generally filtered (e.g., by an N-order low-pass filter) at the input of circuitry (e.g., a VCO) receiving the waveform. Since the waveform is conventionally filtered at the input of circuitry the circuitry (e.g., a VCO), there is no need for the bit stream signal received by the driver circuitry to match the output bit stream provided by the driver circuit.

In accordance with the concepts sought to be protected herein, it has been recognized that in some applications, an important aspect is the average voltage of the driver output rather than for the waveform generated by a driver circuit to be an accurate reproduction of the bit stream signal received by the driver circuit. A result of the above understanding is the recognition that a low speed (and hence, low power) driver circuit (e.g., 360 of FIG. 3) can be configured to operate with a high rate bit stream signal (e.g., a bit stream signal having edge transition times which are faster than that which can be processed by the low speed driver circuit) and still be able to provide a waveform comprising relevant voltage information and average signal levels sufficient for driving circuitry (e.g., a VCO).

As is known in the art, low speed driver circuits generally requires less power and less physical layout space than high speed driver circuits. Furthermore, in instances where the low speed driver circuit is not included in the processor (i.e., the low speed driver circuit is external to the processor generating the pulses), the low speed driver circuit does not require the use of a specialized pin on the processor. Given that the low speed driver circuit requires less power and less physical space, the low speed driver circuit could be included as part of the processor, specifically as part of the same integrated circuit as the processor of the automotive radar apparatus disclosed herein (e.g., 100, shown in FIG. 1).

Figure 5:
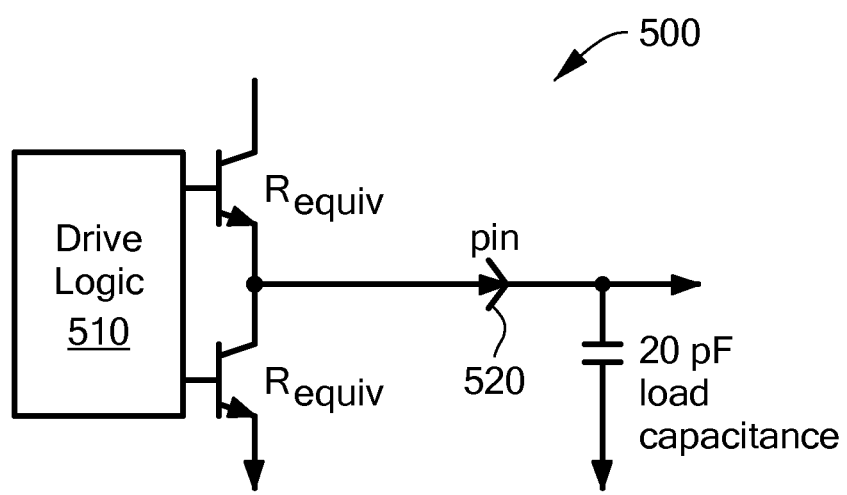
FIG. 5 is a block diagram illustrating an example equivalent circuit for the low speed driver circuits of FIGS. 3 and 3A.

Referring now to FIG. 5, a low speed driver circuit 500, which can be the same as or similar to driver circuits 310, 360 shown in FIGS. 3 and 3A, includes drive logic circuit 510, a plurality of three terminal devices (e.g., npn transistors), a pin 520, and a load capacitance (e.g., 20 pF load capacitance). The three terminal devices, as shown, have associated impedance ($R_{equiv}$). Traditionally, low speed driver circuits comprise substantially greater input impedance (e.g., 1000 Ohms) than high speed driver circuits (e.g., 50 Ohms). In some high speed driver embodiments, such relatively low impedances are needed to provide the sharp transitions (e.g. as described above in conjunction with FIG. 4) associated with the waveforms generated by the high speed driver circuit. In other embodiments, this is due to the rise/fall times associated with signals generated by a low speed driver circuit (e.g., 20 ns) being generally greater (i.e., slower) than the rise/fall times associated with signals generated by a high speed driver circuit (e.g., 1 ns). In the "low" speed driver circuit 500 shown, the input impedance associated with the driver circuit 500 is computed as a function of a required rise/fall time over capacitance (R=Tc/C). The driver circuit is shown coupled to a pin 520, which can be the same as or similar to pin 365 shown in FIG. 3A. As apparent, the "low" speed driver circuit trades off logic size for speed, and thus saves cost.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., automotive radar apparatus). In contrast, the concepts, systems, circuits and techniques sought to be protected herein may be found useful in a wide variety of applications including audio signal processing applications and substantially any application where a semiconductor chip manufacturer desires to include a high-speed, high-performance pulse width modulator (PWM) circuit or a delta-sigma modulator (DSM) circuit (i.e., a PWM or DSM circuit capable of producing a bit stream signal with fast edge transition times, e.g., less than 1 ns) or an equivalent thereof on a semiconductor chip.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An automotive radar apparatus, comprising:
    a bit stream modulation circuit configured to generate a bit stream signal having an associated bit stream rate and having a first output swing at an output thereof;
    a driver circuit having an input coupled to the output of said bit stream modulation circuit and having an output, said driver circuit configured to receive the bit stream signal at the input thereof and configured to generate a corresponding driver bit stream signal having a second output swing at the driver circuit output, wherein the driver circuit has an associated clock rate that is less than the bit stream rate of the bit stream signal, resulting in the second output swing being reduced compared with the first output swing such that the driver bit stream signal is provided having edge transition times that are greater than edge transition times associated with the bit stream signal;
    a filter circuit having an input coupled to the output of said driver circuit and having an output, said filter circuit configured to receive the driver bit stream signal at the input thereof and configured to generate a filtered bit stream signal at the filter circuit output; and
    a voltage controlled oscillator (VCO) having an input coupled to the output of said filter circuit and having an output, said VCO configured to receive the filtered bit stream signal at the input thereof and configured to generate a radio frequency (RF) output signal at the VCO output.

2. The apparatus of claim 1, wherein the bit stream modulation circuit, the driver circuit, and the filter circuit form at least part of a VCO tuning circuit in the automotive radar apparatus, wherein the filtered bit stream signal generated by the filter circuit is provided as a tuning signal.

3. The apparatus of claim 2, wherein the tuning signal is provided in the form of a Tune Voltage.

4. The apparatus of claim 1, wherein said bit stream modulation circuit is provided as part of a processor.

5. The apparatus of claim 1, wherein said driver circuit is provided as part of a processor.

6. The apparatus of claim 1, wherein said bit stream modulation circuit and said driver circuit are provided in a single processor.

7. The apparatus of claim 6, wherein said processor is provided in a single integrated circuit.

8. The apparatus of claim 6, wherein said processor is arranged over a common substrate.

9. The apparatus of claim 1, wherein said filter circuit is provided as a filtering device having a low-pass filter characteristic.

10. The apparatus of claim 1, wherein:
    the bit stream modulation circuit is provided having a calibration circuit coupled to receive a bit stream input signal at an input thereof and configured to tune the bit stream input signal to account for non-linearity of the VCO in generating the bit stream signal; and
    the bit stream signal is provided having a desired bit stream.

11. The apparatus of claim 9, wherein the bit stream modulation circuit is further provided having a data buffer module coupled to receive, store, and/or process the bit stream signal and adapted to couple to the driver circuit.

12. The apparatus of claim 1, wherein the bit stream modulation circuit is provided having a pulse width modulator (PWM) circuit or a delta sigma modulator (DSM) circuit.

13. The apparatus of claim 1, wherein the bit stream modulation circuit is provided having a one-bit digital-to-analog converter (DAC).

14. The apparatus of claim 1, wherein said driver circuit configured to generate said driver bit stream signal has a first equivalent resistance and an alternative driver circuit configured to generate an alternative driver bit stream signal has a second equivalent resistance that is substantially less than the first equivalent resistance, wherein the alternative driver bit stream signal has edge transition times that are substantially equal to edge transition times associated with said bit stream signal.

15. A method, comprising:
    generating, with a bit stream signal modulation circuit, a bit stream signal having an associated bit stream rate and having a first output swing;
    generating, with a driver circuit, a driver bit stream signal having a second output swing, wherein the driver circuit has an associated clock rate that is less than the bit stream rate of the bit stream signal, resulting in the second output swing being reduced compared with the first output swing such that the driver bit stream signal is provided having edge transition times that are greater than edge transition times associated with the bit stream signal;

generating, with a filter circuit, a filtered bit stream signal from said driver bit stream signal; and providing the filtered bit stream signal to a voltage controller oscillator (VCO) for generating a radio frequency (RF) output signal from said filter bit stream signal.

16. A method of claim 15, wherein generating a bit stream signal comprises:

receiving a bit stream input signal;

tuning the bit stream input signal to account for non-linearity of the VCO; and generating a bit stream signal from said tuned bit stream input signal.

17. A method of claim 15, wherein generating a bit stream signal further comprises:

providing the bit stream signal to an input of a driver circuit.

18. A method of claim 17, wherein providing the bit stream signal to an input of a driver circuit comprises:

storing the bit stream signal in a data buffer;

shifting data stored in the bit stream signal in accordance with a desired bit stream to produce a shifted bit stream signal; and providing the shifted bit stream signal to an input of a driver circuit.

19. The apparatus of claim 1, wherein the first output swing occurs from a first voltage to a second voltage that is different from than first voltage, and the second output swing occurs from a third voltage to a fourth voltage that is different than the third voltage, wherein the third and fourth voltages are both different from the first and second voltages.

20. The apparatus of claim 19, wherein the bit stream signal has a first average voltage value corresponding to an average of the first and second voltages, and the driver bit stream signal has a second average voltage value corresponding to an average of the third and fourth voltages, wherein the first average voltage is substantially similar to the second average voltage.

21. The apparatus of claim 1, wherein the associated clock rate of the driver circuit is substantially less than the bit stream rate of the bit stream signal, resulting in the second output swing being substantially reduced compared with the first output swing such that the driver bit stream signal is provided having edge transition times that are substantially greater than edge transition times associated with the bit stream signal.

22. The apparatus of claim 21, wherein the clock rate of the driver circuit is between about ten and about twenty times less than the bit stream rate of the bit stream signal.

* * * * *